United States Patent [19]

Maamari et al.

[11] Patent Number: 5,420,871
[45] Date of Patent: May 30, 1995

[54] METHOD FOR MAINTAINING BUS INTEGRITY DURING TESTING

[75] Inventors: Fadi Maamari; Paul E. Murphy, both of Princeton, N.J.

[73] Assignee: AT&T Corp., Murray Hill, N.J.

[21] Appl. No.: 218,166

[22] Filed: Mar. 28, 1994

[51] Int. Cl.$^6$ ............................................. G06F 11/00
[52] U.S. Cl. .................................. 371/29.5; 395/575
[58] Field of Search ...................... 371/29.5, 22.3, 24; 395/575, 325; 364/229.2, 240.1, 240.2

[56] References Cited

U.S. PATENT DOCUMENTS 5,373,514 12/1994 Ma ..................................... 371/29.5

OTHER PUBLICATIONS

Y. Koseko, T. Ogihara, and S. Murai, "Tri-State Bus Conflict Checking Method for ATPG Using BDD", International Conference on Computer-Aided Design, Santa Clara, Calif., Nov., 1993.

Primary Examiner—Vincent P. Canney
Attorney, Agent, or Firm—Robert B. Levy

[57] ABSTRACT

The integrity of a bus (16) may be maintained in a circuit (10) during testing by first scrutinizing the circuit to learn whether a potential conflict will ever exist on the bus for any combination of input values to the circuit. If no conflict will ever exist, then the bus is deemed a no-conflict bus, and nothing further need be done to that bus during testing. Should the bus be found to be a potential conflict bus, then a bus justification vector is generated for application to the circuit to maintain the integrity of the bus intact during testing.

4 Claims, 3 Drawing Sheets

5,420,871

METHOD FOR MAINTAINING BUS INTEGRITY DURING TESTING

TECHNICAL FIELD

This invention relates to a technique for maintaining the integrity of a bus in a circuit during testing.

BACKGROUND OF THE INVENTION

Many circuits have one or more buses, each characterized by a node that receives the output signal from two or more devices in the circuit, typically, although not necessarily, tri-state gates. The presence of such buses within a circuit increases the difficulty of testing the circuit by conventional techniques because such techniques often do not maintain the integrity of such buses during testing. Bus integrity is susceptible to several different definitions. The definition appropriate for a specific circuit is often determined by the particular design style used by the designer of the circuit and by the technology and process employed to fabricate the circuit. Most commonly, the integrity of a bus is said to exist, when, following the application of new test stimuli (i.e., new test vectors) to the circuit, the bus is supplied with at most one non-high impedance (i.e., a non-Z) input signal. If two or more non-Z signals are supplied to the same bus under steady-state conditions, then a bus conflict is deemed to exist. Under some circumstances, a bus conflict is deemed to occur if no non-Z input signal is supplied to the bus, as well as if two or more non-Z signals are supplied to the bus simultaneously under steady-state conditions.

Depending on the design of the circuit, and the technology used in its fabrication, bus integrity may be deemed intact as long as all non-Z signals supplied to the bus have the same logic state. Conversely, a bus conflict occurs when two or more of the signals supplied to the bus have a different logic state. Indeed, if the bus is supplied with logic "1" and logic "0" level signals from first and second devices, respectively, during steady-state conditions, then a short is present which could damage the circuit. For the condition when the bus is supplied with different strength signals, bus integrity remains intact as long as all of the highest strength logic signals (non-Z input signals) on the bus have the same logic value following the application of new test stimuli to the circuit. If one or more of the highest strength signals have a logic value different from the other highest strength signals, then a bus conflict occurs.

A circuit, including one containing one or more buses, is usually tested by applying test stimuli to the circuit. There are several known algorithms by which such test stimuli may be generated, so that when the test stimuli are applied, faults in the circuit are detected. Each test stimulus is a vector comprised of specified and unspecified values (the unspecified values being "don't care" values). Heretofore, automatic test stimuli generation algorithms of the prior art have maintained bus integrity by performing bus justification on a global basis within the circuit to justify each bus in advance of the application of each successive test stimulus. Such bus justification was accomplished by determining the values needed at the primary inputs to the circuit to avoid a conflict on each bus and then adding these necessary values to each test vector in advance of its application. As may be appreciated, justifying each bus (i.e., determining the values needed at the primary circuit inputs to avoid a bus conflict) in advance of the application of each successive test stimulus can be time consuming, especially when the number of test vectors to be applied is large.

Thus, there is a need for a technique for maintaining the integrity of each bus in a circuit in connection with testing.

SUMMARY OF THE INVENTION

Briefly, in accordance with a preferred embodiment of the invention, a technique is disclosed for maintaining the integrity of at least one bus in a circuit during testing. The first step of the method of the invention is to determine whether the bus in question is a "no-conflict" bus. In other words, a determination is made whether a conflict will ever be present on the bus for any possible combination of signals to the circuit at its primary inputs. If no conflict is ever possible, then the bus is deemed to be a no-conflict bus and nothing further needs to be done to the bus during testing of the circuit because regardless of the test stimuli applied to the circuit, the integrity of a no-conflict bus always remains intact.

However, should the bus be found to have a potential conflict, then there is a need to justify the bus during test generation to avoid such potential conflicts. To the extent that justification is possible (that is, the bus incurs no conflicts on a power-up condition), a bus justification vector is generated by a back-tracing routine that establishes the values that are needed at the primary circuit inputs to maintain the bus in a no-conflict state. Once generated, the bus justification vector is combined with each test vector to be applied during testing. As long as there is no conflict between the bus justification vector and each test vector, then no further bus justification is needed. Thus, unlike past techniques, the method of the invention does not always require bus justification for each new test stimulus, thereby saving test time and effort.

DETAILED DESCRIPTION

General Background

Figure 1:
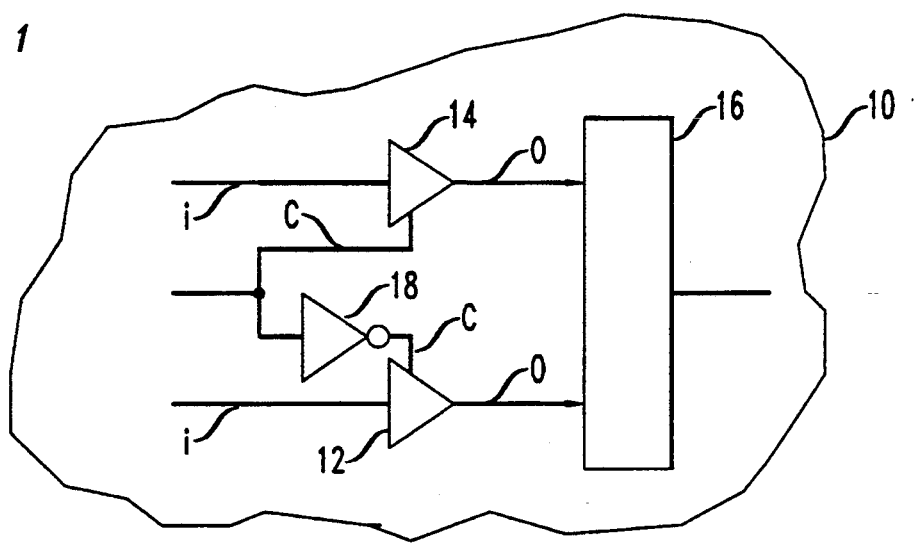
FIG. 1 is a block schematic diagram of a portion of a prior-art integrated circuit that has a bus driven by at least two devices.

Before proceeding to discuss the method of the present invention for maintaining bus integrity, a brief explanation of bus integrity may prove helpful. Referring to FIG. 1, there is shown a portion of a prior-art circuit 10 that contains at least two devices 12 and 14, each typically comprising a tri-state gate, although the device may take on a different form. Each of the tri-state gates 12 and 14 has input line i, an output line o, and an a control line c. While the control line c of each of the tri-state gates 12 and 14 is active, the tri-state gate passes the signal on its input line i to its output line o. While each tri-state gate's control line c is inactive, then the output line o of each tri-state gate is forced to a high impedance (Z) state regardless of the level of the signal on its input line i. The tri-state gates 12 and 14 have their output lines o coupled to each other at a point 16, hereinafter defined as a bus. Since the bus 16 is supplied with the output signals from both the tri-state gates 12 and 14, the potential exists for a conflict on the bus.

Bus integrity, that is, the absence of a conflict on the bus 16, is susceptible to different meanings, as indicated previously. Consider the most common type of bus integrity (hereinafter described as bus integrity of the first type). Bus integrity of the first type is said to exist when, after the application of new test stimuli (i.e., new test vectors) to the circuit 10 (resulting in new stimuli on the input lines i of the tri-state gates 12 and 14), the circuit settles to a state where the bus 16 is supplied with no more than one non-Z input signal. Thus, for bus integrity of the first type to exist, one of the tri-state gates 12 and 14 must be tri-stated (i.e., its control line c must be inactive) so as to produce a Z signal on its output line o while the other gate is "active" to pass the signal on its input line i to its output line o or while the other gate is also tri-stated.

In the illustrated embodiment of FIG. 1, the control signal applied to the control line c of the tri-state gate 14 is also applied to the input of a NOT gate 18 whose output signal is supplied to the control line c of the tri-state gate 12. Therefore, one of the gates 12 and 14 is always tri-stated (i.e., inactive) while the other is not. Thus, the bus 16 always enjoys integrity of the first type because only one of the two tri-state gates 12 and 14 is active at any one time.

Bus integrity of the second type is said to exist when, after the application of new test stimuli to the circuit 10, the circuit settles to a state where a single non-Z input signal is supplied to the bus 16. Thus, a bus conflict arises under this scenario when no non-Z input signals are supplied to the bus 16, or two or more input signals are supplied to the bus (even if both are at the same logic level).

A third type of bus integrity is said to exist when, after the application of new test stimuli to the circuit 10, all of the non-Z input signals to the bus 16 have the same logic level. Thus, a bus conflict exists under this scenario when one of the input signals to the bus 16 is at a logic "1" level while another is at a logic "0" level. A fourth type of bus integrity is said to exist when, after the application of new stimuli to the circuit 10, the circuit settles to a state where all of the highest strength (non-Z) input signals to the bus 16 have the same logic value. A bus conflict arises under this scenario when one of the highest strength input signals supplied to the bus 16 has a different logic value than the other highest strength signals received at the bus.

Bus Learning

Figure 2:
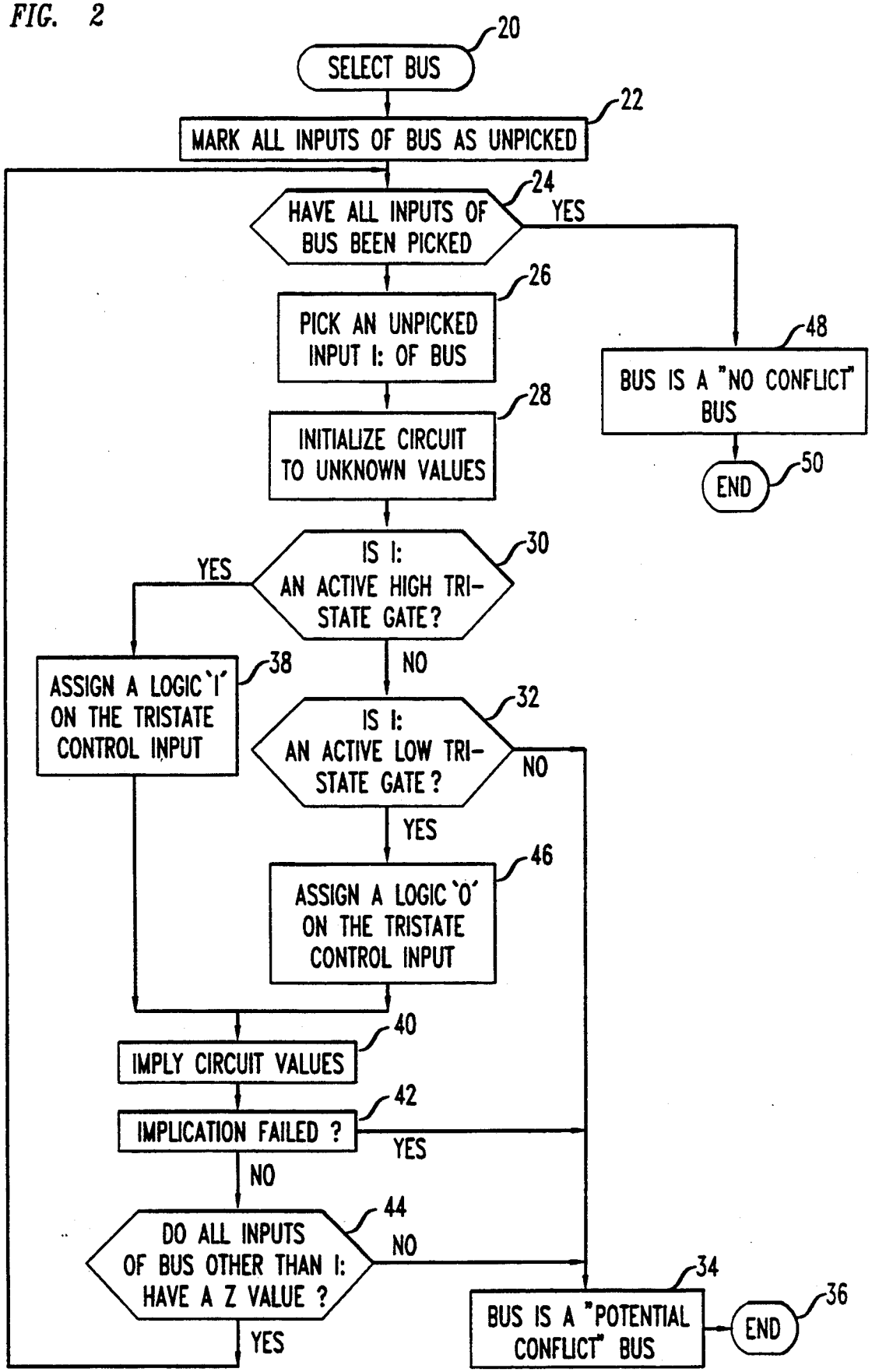
FIG. 2 is a flowchart representation of a process, in accordance with the invention, for determining the status of each bus in the circuit of FIG. 1.

Bus integrity of the first type is maintained, in accordance with the invention, by first scrutinizing each bus 16 within the circuit 10 to identify whether the bus is a "no-conflict" bus. In other words, each bus 16 within the circuit 10 is examined to learn whether there exists any combination of input signals or sequence of signals supplied to the bus that will give rise to a conflict of the first type. Referring now to FIG. 2, there is shown a flowchart representation of a routine, in accordance with the invention, for examining a bus to learn whether the bus is a no-conflict bus so that bus integrity of the first type always remains intact. Execution of the bus-learning routine of FIG. 2 is commenced by first executing step 20 whereupon a bus 16 in the circuit 10 is selected for examination, the selected bus hereinafter being referred to as "BUS". Following step 20, step 22 is executed and each of the inputs of BUS (designated as $I_1, I_2 \ldots I_n$, where n is an integer $\geq 2$) is designated (marked) as being unpicked during step 22.

As will be become better understood hereinafter, to learn if BUS is a no-conflict bus, a successive one of the inputs to BUS is picked, and certain values within the circuit 10 are implied (i.e. imputed) to devices within the circuit to determine if a conflict might arise that would violate the first type of bus integrity. Knowing which input of BUS has been picked is important for the purpose of implying proper values to the devices in the circuit 10 to determine if the first type of bus-integrity exists. When the bus-learning process of FIG. 2 is first executed, none of the inputs of BUS have yet been designated so an indication is made during step 22 that no inputs have yet been picked to permit any of the inputs to be selected as described hereinafter.

After step 22, step 24 is executed and a determination is made whether all of the inputs of BUS have been picked. As just discussed, upon the initial execution of the bus-learning routine of FIG. 2, all of the inputs of BUS are designated as unpicked during step 22. When unpicked inputs of BUS are found to exist during step 24, then step 26 is executed and a previously unpicked BUS input $I_i$ (where i is an integer $\leq n$) is picked. Once an input $I_i$ has been picked, then the circuit 10 is initialized to unknown values during step 28 to avoid a potentially inaccurate characterization of BUS. Next, step 30 is executed and a determination is made whether the BUS input $I_i$ that was selected corresponds to the output of an active high tri-state gate. In other words, a determination is made during step 30 whether the input $I_i$ to BUS is the output of a tri-state gate, (such as the gate 14 of FIG. 1) that is active upon the receipt of a logic high or "1" signal on its control line c so as to render the tri-state gate operative to pass the signal on its input line i to its output line o.

If the input $I_i$ is not found to be the output of an active high tri-state gate during step 30, then step 32 is executed and a determination is made whether the input $I_i$ is the output of an active low tri-state gate. In other words, a determination is made during step 32 whether the input $I_i$ is the output of a tri-state gate that is active when a logic low of "0" is applied on its control line c to enable the tri-state gate to pass the signal on its input line i to its output line o. Should the input $I_i$ not be the output of an active low tri-state gate, then execution of the bus-learning routine branches to step 34 whereupon BUS is designated as a potential conflict bus. As may be appreciated, if the input $I_i$ is not the output of either an active low or active high tri-state bus, than the input must be the output of some other device that cannot be controlled like a tri-state gate. Consequently, if the device supplying the input $I_i$ cannot be controlled like a tri-state gate, then a bus conflict is possible. Following step 34, step 36 is executed, and the bus-learning routine ends with respect to examination of the selected bus. (The bus-learning routine of FIG. 2 is now ready to be executed for the next selected bus.)

Still referring to FIG. 2, if, during execution of step 30, the input $I_i$ was found to be the output of an active high tri-state gate (e.g., gate 14 of FIG. 1), then, step 38 is executed and a logic high level signal is assigned or attributed to the control line c of this active high tri-state. Next, step 40 is executed and logic values are implied to those devices in the circuit which supply control line c of this active high tri-state gate to cause a logic high level signal to appear on tri-state gate control line c. In other words, during step 46, a logic high level signal is assumed on the control line c of the active tri-state gate whose output line o forms the input $I_i$ of BUS. From the control line c of the active high tri-state gate, a backwards path is traced in the circuit to establish the logic values that must be produced by the devices in the circuit in order yield a logic high level on the tri-state gate control line c.

Following step 40, a check is made during step 42 to determine if the implication previously performed has established all the values within the circuit that are needed for a logic high level signal to be present on the control line c of the active high tri-state gate without a conflict. Depending on the design of the circuit 10, it may not be possible to imply some of the values needed to create the proper logic value on the tri-state gate control line c without the possibility of implying conflict in values on one or more device inputs or outputs. If the implication process encounters a conflict, then a branch is made to step 34 and BUS is indicated as a potential conflict bus. As may be appreciated, an inability to imply all of the values in the circuit needed to place the proper value on the control line c of the tri-state gate indicates that the tri-state gate cannot be completely controlled to always insure bus integrity of the first type.

Assuming that the implication performed during step 40 did not create a conflict when checked during step 42, then step 44 is executed and a determination is made whether all of the inputs of BUS, (other than the input $I_i$) have a Z (i.e., high impedance) value. In other words, during step 44, a check is made whether all of the inputs to BUS other than the input $I_i$ are the outputs of inactive tri-state gates. If such is the case, then execution of the bus-learning routine of FIG. 2 reverts to step 24 since there will be no conflict on BUS under these conditions.

Referring to step 32, it may be that the input $I_i$ is the output of an active low tri-state gate, rather 'than the output of an active high state gate as described with respect to step 30. Should the input $I_i$ be the output of an active low tri-state gate, then step 46 is executed and a logic low or "0" level signal is assigned to the control line c of the tri-state gate in much the same way that a logic high level signal was assigned to control line c of the active high tri-state gate during step 38. Following step 46, then step 40 is re-executed, and values are implied for the devices in the circuit 10 in order to achieve a logic low level signal on the gate control line c, rather than a logic high level signal as was the case during execution of step 40 following step 38. Following step 40, step 42 and those following it are re-executed as described previously.

Returning to step 24, unless all of the inputs of BUS have been picked, step 26 will be executed as described. However, if all of the inputs of BUS have been picked and no conflict has yet been identified, then step 48 is executed and BUS is identified as a no-conflict bus. Thereafter, execution of the bus-learning process of FIG. 2 for the selected bus ends (step 50).

As may be appreciated, the bus 16 of circuit 10 of FIG. 1, when examined during the bus-learning routine of FIG. 2, will be deemed to be a no-conflict bus. Regardless of whether the tri-state gates 12 and 14 are active high or active low, for either of the two inputs of the bus 16, the other input is always at a high Z level. Consequently, for the bus 16 of FIG. 1, all of the inputs other than the selected input $I_i$ will always be found to have a Z value during step 44, and hence, the bus will be deemed a no-conflict bus during step 48.

It should be noted that the bus-learning routine of FIG. 2 is designed to detect whether bus integrity of the first type is intact. To detect whether each of the three other types of bus integrity are intact, the bus-learning routine of FIG. 2 would have to be modified, particularly, with respect to step 44, in accordance with the criterion defining the type of bus integrity of interest.

Bus Justification

Figure 3:
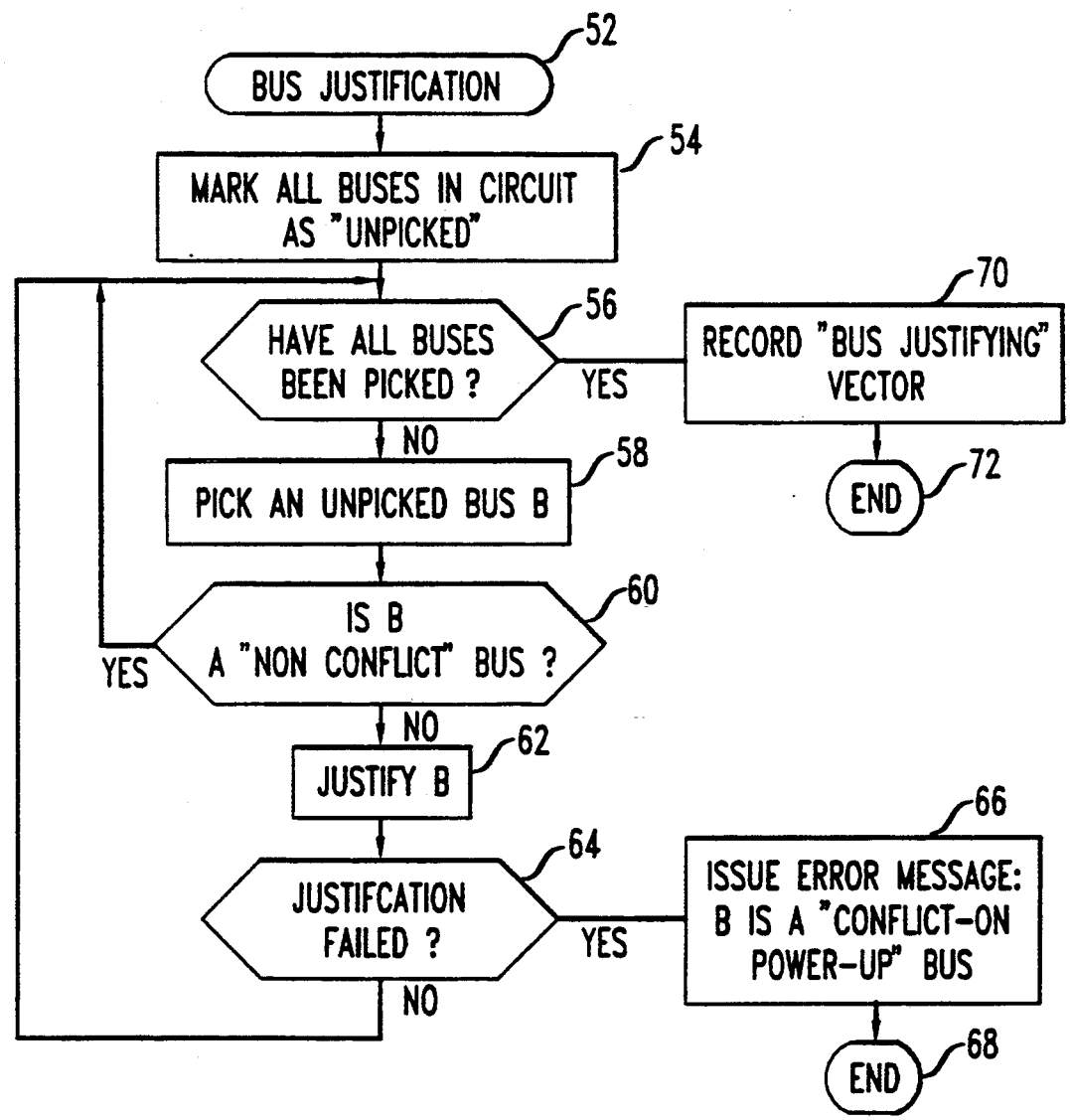
FIG. 3 is a flowchart representation of a process, in accordance with the invention, for generating a bus justification vector for application to the circuit of FIG. 1 to justify each potential conflict bus.

If, after executing the bus-learning routine of FIG. 2 for each bus 16 in the circuit 10, one or more buses are found to have a potential conflict of the first type, then justification of such potential conflict buses is necessary prior to testing, that is, prior to the application of test stimuli, if conflicts are to be avoided. Referring to FIG. 3, there is shown a flowchart representation of a routine, in accordance with the invention, for justifying those buses 16 in the circuit 10 identified as potential conflict buses. The bus justification routine is begun upon execution of step 52 whereupon various values are initialized. Following step 52, step 54 is executed and all of the buses 16 in the circuit 10 are marked as "unpicked." As will be appreciated hereinafter, during execution of the bus justification routine of FIG. 3, each successive bus 16 in the circuit 10 of FIG. 1 is picked to first determine whether the bus is a no-conflict bus, and if not, that bus is justified. However, upon initial execution of the bus justification routine, none of the buses should be selected, so it is necessary during step 54 to indicate such a state of affairs.

Step 56 is executed following step 54. Upon execution of step 56, a determination is made whether all of the buses in the circuit 10 have been picked. Upon the initial execution of the bus justification routine of FIG. 3, all of the buses are designated as being unpicked by virtue of the execution of step 54. Thus, upon the initial execution of step 56, not all of the buses will have been found to be picked. Under this condition, step 58 is executed following step 56 and an unpicked one of the buses is then picked. For ease of discussion, the bus picked during step 58 is hereinafter designated as "B."

After the bus B is picked during step 58, a check is made during step 60 whether the bus B just picked is a no-conflict bus, as determined during execution of the bus learning routine of FIG. 2. If the bus B is a no-conflict bus, then execution of the bus justification routine of FIG. 3 branches to step 56. However, if the bus B is a potential conflict bus, then step 62 is executed and the bus B is justified.

Justification of the bus B is accomplished during step 62 by first establishing a set of input values to the bus that assure bus integrity of the first type as discussed previously. Once such a set of bus input values is established, then the bus inputs are back-traced to establish a set of input values for those devices whose outputs form the inputs to the bus B. Once the input values for the devices that directly drive the bus B have been established, then the input values for those devices that supply the devices directly driving the bus are established and so on. Eventually(if justification is possible) a set of values will be established, which, when applied to the primary inputs of the circuit 10, assure integrity of the bus B. Note that justifying a given bus may not require a particular input value at every primary circuit input. Those primary circuit inputs that do not require a particular input value (i.e., a logic high level or logic low level value) are assigned a "don't care" value.

As suggested, justification of the selected bus B may not be possible. In other words, it is not possible to establish a set of values at the primary circuit inputs which will maintain the integrity of the bus B. For this reason, a determination is made during step 64 whether the justification attempted during step 62 failed. If bus justification failed when checked during step 64, then step 66 is executed and an error message is generated, indicating that the bus B is not justifiable, typically because it is a "conflict on power-up" bus, because a conflict occurs when the circuit 10 is initially energized.

Assuming that the bus B was found to be justifiable during step 64, then execution of the bus justification routine returns to step 56 whereupon a check is again made whether all the buses have been picked. Eventually, all of the buses will be picked (by virtue of successively executing step 58). Once all of the buses have been picked, step 70 is executed and a bus justification vector (representing the collection of the values obtained for the individual buses as each is successively justified during step 62) is then recorded. Thereafter, step 72 is executed, whereupon execution of the bus justification routine ends.

The bus justification vector obtained during step 70 of FIG. 3 is utilized to specify the unspecified values of each successive test stimulus (vector) prior to the application of such vector to the circuit 10 at its primary inputs (not shown). In other words, the bus justification vector generated during step 70 is logically combined with each successive test vector so that the "don't care" values of the test vector are replaced by the corresponding specified values in the bus justification vector. In this way, conflicts during testing are avoided.

In the process of combining the bus justification vector with each successive test vector, a conflict may exist between one or more specified values in the test vector and the corresponding specified values in the bus justification vector. If such a conflict is found, then the process of bus justification, as described in FIG. 3, is repeated, but only for those buses that are controlled by the specified bus justification vector values found to be in conflict with the corresponding specified test vector values. Them is no need to justify those buses controlled by specified values in the bus justification vector that are not in conflict with the corresponding specified test vector values. Should it not be possible, during such local bus justification, to obtain specified values in the bus justification vector that do not conflict with the corresponding specified values in the test vector, then the test vector must be rejected.

Thus, as compared to the prior art, which mandates the need to justify each bus for each test stimulus, the method of the invention performs bus justification on a global basis only once at the outset of test generation. To the extent that a conflict arises between one or more specified values in the bus justification vector generated during step 70, and one or more corresponding specified values in each test vector, bus justification is performed (to the extent that such justification is possible) on a local basis for those buses controlled by the specified bus justification values found to be in conflict. Thus the bus justification technique of the invention saves time and effort by avoiding the need to perform global bus justification in advance of the application of each successive test stimulus.

Bus Integrity During Scan Testing

The presence of one or more buses in a circuit can give rise to difficulties during scan testing, particularly if a regular primary circuit input is also a scan input. This may best be understood by reference to FIG. 4 which illustrates a prior art circuit 74 that has been partitioned to into a logic block 75 that may contain one or more buses (not shown) and a scan chain 76. The scan chain 76 is comprised of one or more scan flip-flops 78, each having its input supplied with the output signal of a scan flip-flop multiplexer 80 that multiplexes the output of an upstream flip-flop with an output of the logic block 75 (or in the case of the first flip-flop in the chain, a scan input). The output of each scan flip-flop 78 is not only supplied to each downstream scan flip-flop multiplexer 80 but also to the logic block 75. The idea behind partitioning the circuit 74 in this manner is to facilitate testing of the circuit by scanning values through the scan chain 76 while simultaneously applying test stimulus to the logic block 74 to increase the level of fault detection.

Figure 4:
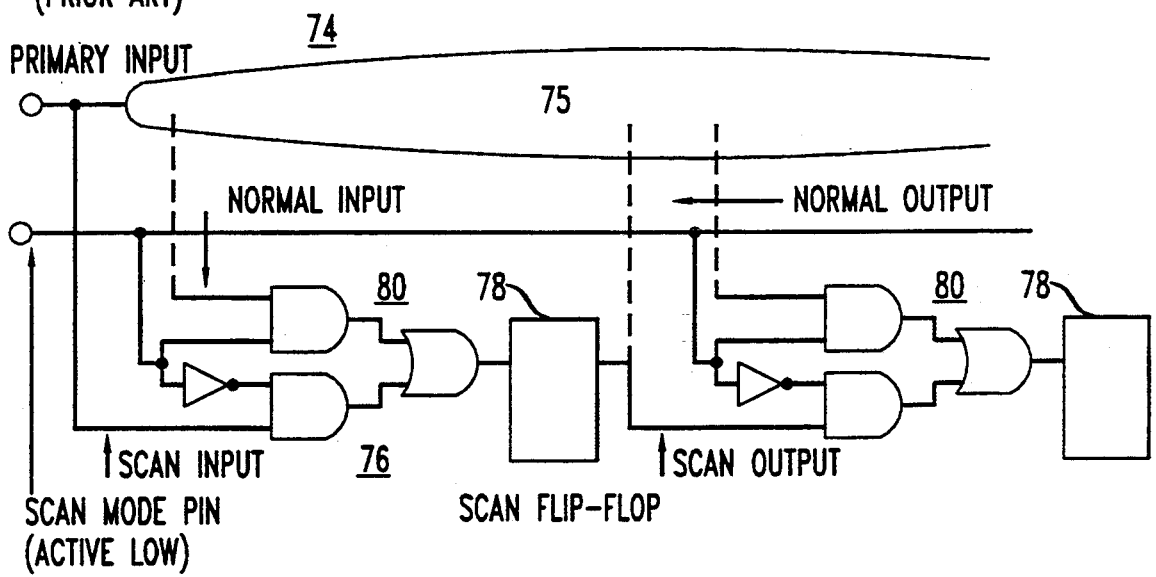
FIG. 4 is a block schematic diagram of a prior-art circuit designed for scan testing.

In the circuit 74 of FIG. 4, a primary circuit input is also an input to the scan chain 76. In the absence of some mechanism for justifying the buses within the logic block 75, the scanning of values through the scan chain 76 may cause conflicts to arise on the buses within the logic block 75. In the past, the logic block had to be modified by the addition of hardware (not shown) that would disable the buses to avoid such conflicts. The addition of such hardware caused an increase in overhead, and a loss in performance.

For the circuit of FIG. 4, the method of the invention for maintaining bus integrity can be employed without any need to modify the circuit if the number of scan chain inputs is less than the number of "don't care" inputs (values) of the bus justifying vectors generated in accordance with the bus justification routine of FIG. 3. If D is the set of don't care inputs in the bus justifying vector, then the inputs D can be selected as inputs to the scan chains 76 (only one shown in FIG. 4). During the scan phase, the bus justifying vector values not in D are applied to the regular primary inputs of the circuit, thereby maintaining bus integrity.

Figure 5:
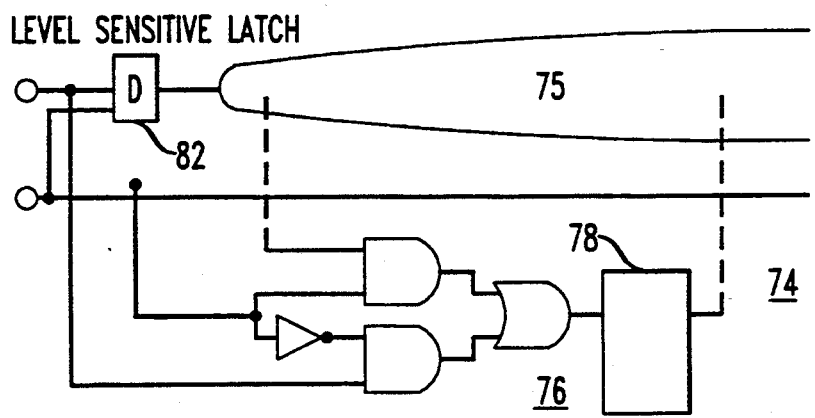
FIG. 5 is a block schematic diagram of the circuit of FIG. 4 showing a modification, in accordance with the invention, for maintaining bus integrity during scan testing.

If the number of scan chain inputs is larger than D, then a slightly different procedure is necessary. First, all inputs in D (the set of don't care inputs of the bus justifying vector) are selected as inputs to the scan chains 76. Referring now to FIG. 5, the regular primary inputs of the circuit not in D are selected for the remaining scan chain inputs. For each such input, a level-sensitive latch 82 of FIG. 5 is inserted between the primary input and the logic block 75. During the scan phase, the bus-justifying vector is applied to the primary circuit inputs. Thereafter, the scan values are applied while the bus-justifying values of the bus justification vector are applied to the regular primary inputs not in D that are not used as scan chain inputs. Each inserted latch 82 is controlled by a scan mode input and serves to hold the needed bus-justifying value on a corresponding input of the logic block 75 required to maintain bus integrity.

As should be appreciated, the latches 82 are added ahead of, that is, at the periphery of, the logic block 75. Adding the level-sensitive latches 82 on the periphery of the circuit 75, in accordance with the invention, requires less design effort than adding hardware deep within the circuit for disabling the buses as was done in the prior art.

The foregoing describes a technique for maintaining the integrity of a bus 16 within a circuit 10 during testing.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for maintaining the integrity of at least one signal bus in a circuit, comprising the steps of:
   - determining whether a potential conflict can exist on the bus for any combination of input signals to the circuit; and if such a conflict can exist, then
   - generating, when a bus conflict is possible, a bus justification vector, which, when applied to the circuit, causes a set of predetermined signals to appear on the bus so that no conflict is present; and
   - applying the bus justification vector to the circuit, when a bus conflict is possible, to maintain the bus in a no-conflict state.

2. The method according to claim 1 wherein a potential conflict on the bus is determined by the steps of:
   - initializing the circuit to unknown values;
   - successively determining whether each input to the bus comprises the output of a tri-state gate, and if not, then indicating that the bus is a potential conflict bus; and
   - implying, if possible, for each successive input to the bus which is established to be the output of a tri-state gate, logic values needed in the circuit which would cause the tri-state gate to be active;
   - determining whether implication of all logic values in the circuit is possible, and if not, then indicating that the bus is potential conflict bus; and
   - determining whether each bus input, other than the bus input established to be output of a tri-state gate, is a high-impedance value when the tri-state gate is active, and if not, designating the bus as a potential conflict bus,
   - otherwise, if all inputs to the bus, other that the input from the tri-state gate, are high impedance when the gate is active, then designating the bus as a no-conflict bus.

3. The method according to claim 1 wherein the bus justification vector is generated by the steps of:
   - establishing for the input to the bus, a first set of values that will maintain the integrity of the bus intact; and
   - back-tracking from the inputs to the bus to establish a second set of values which, when applied to the circuit, causes the first set of values to appear on the bus inputs.

4. A method for maintaining the integrity of least one signal bus in a circuit having primary inputs, the circuit partitioned so as to have a logic portion containing the bus, and at least one scan chain such that the scan chain and logic portion share at least one common input, the method comprising the steps of:
   - determining whether a potential conflict can exist on the bus for any combination of input signals applied to the primary circuit inputs, and if such a conflict can exist, then;
   - generating, when a bus conflict is possible, a bus justification vector, which, when applied to the circuit, causes a set of predetermined signals to appear on the bus so that no conflict is present; and
   - inserting, between the logic portion and each primary input that is common with a scan input, a level-sensitive latch;
   - applying the bus justification vector to the primary circuit inputs; and
   - applying scan values to the scan inputs.

* * * * *